(12) United States Patent
Zhou et al.

(10) Patent No.: US 9,786,789 B2
(45) Date of Patent: Oct. 10, 2017

(54) MANUFACTURE METHOD OF LTPS THIN FILM TRANSISTOR AND LTPS THIN FILM TRANSISTOR

(71) Applicant: Shenzhen China Star Optoelectronics Technology Co., Ltd., Shenzhen (CN)

(72) Inventors: Xingyu Zhou, Shenzhen (CN); Xiaoxing Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 104 days.

(21) Appl. No.: 14/786,550

(22) PCT Filed: Aug. 24, 2015

(86) PCT No.: PCT/CN2015/087907
§ 371 (c)(1),
(2) Date: Oct. 23, 2015

(87) PCT Pub. No.: WO2017/020358
PCT Pub. Date: Feb. 9, 2017

(65) Prior Publication Data
US 2017/0155002 A1    Jun. 1, 2017

(30) Foreign Application Priority Data
Aug. 4, 2015 (CN) .......................... 2015 1 0471290

(51) Int. Cl.
*H01L 29/10* (2006.01)
*H01L 29/76* (2006.01)
(Continued)

(52) U.S. Cl.
CPC .. *H01L 29/78675* (2013.01); *H01L 21/31111* (2013.01); *H01L 29/0688* (2013.01);
(Continued)

(58) Field of Classification Search
CPC ........... H01L 29/78675; H01L 29/0688; H01L 29/78696; H01L 21/31111;
(Continued)

(56) References Cited

U.S. PATENT DOCUMENTS

2002/0006689 A1* 1/2002 Miyasaka ........... C23C 16/0209
438/149
2007/0267635 A1* 11/2007 Chang ................. H01L 29/4908
257/72
(Continued)

FOREIGN PATENT DOCUMENTS

CN    102763202 A    10/2012
CN    103050410 A    4/2013
CN    104733536 A    6/2015

*Primary Examiner* — Victor A Mandala
(74) *Attorney, Agent, or Firm* — Leong C. Lei

(57) ABSTRACT

The present invention provides a manufacture method of a LTPS thin film transistor and a LTPS thin film transistor. The gate isolation layer is first etched to form the recess, and then the gate is formed on the recess so that the width of the gate is slightly larger than the width of the recess. Then, the active layer is implemented with ion implantation to form the source contact region, the drain contact region, the channel region and one transition region at least located between the drain contact region and the channel region. The gate isolation layer above the transition region is thicker than the channel region and can shield a part of the gate electrical field to make the carrier density here lower than the channel region to form a transition.

8 Claims, 6 Drawing Sheets

(51) Int. Cl.
*H01L 31/036* (2006.01)
*H01L 31/112* (2006.01)
*H01L 29/786* (2006.01)
*H01L 29/06* (2006.01)
*H01L 29/66* (2006.01)
*H01L 29/423* (2006.01)
*H01L 21/311* (2006.01)

(52) U.S. Cl.
CPC .. *H01L 29/42384* (2013.01); *H01L 29/66757* (2013.01); *H01L 29/78624* (2013.01); *H01L 29/78696* (2013.01)

(58) Field of Classification Search
CPC ......... H01L 29/42384; H01L 29/78624; H01L 29/66757
See application file for complete search history.

(56) References Cited

U.S. PATENT DOCUMENTS

| | | | |
|---|---|---|---|
| 2009/0184321 A1* | 7/2009 | Tsai | H01L 29/66757 257/66 |
| 2013/0087783 A1* | 4/2013 | Wang | H01L 21/316 257/43 |
| 2014/0141579 A1* | 5/2014 | Tian | C30B 13/24 438/166 |
| 2016/0027855 A1* | 1/2016 | Kim | H01L 27/1222 257/72 |
| 2016/0254368 A1* | 9/2016 | Jiang | H01L 21/28088 257/72 |
| 2016/0343830 A1* | 11/2016 | Li | H01L 21/268 |
| 2017/0110489 A1* | 4/2017 | Lu | H01L 27/1274 |

\* cited by examiner

MANUFACTURE METHOD OF LTPS THIN FILM TRANSISTOR AND LTPS THIN FILM TRANSISTOR

FIELD OF THE INVENTION

The present invention relates to a display technology field, and more particularly to a manufacture method of a LTPS thin film transistor and a LTPS thin film transistor.

BACKGROUND OF THE INVENTION

In the flat panel display, such as the liquid crystal display (LCD), the Organic Light-Emitting Display or Inorganic Light-Emitting Display, the thin film transistor is generally employed to be a switch element to control the operation of the pixel or employed to be a drive element to drive the pixel. The thin film transistor generally can be categorized into two kinds, amorphous silicon (a-Si) and polysilicon (Poly-Si) according to the silicon thin film property.

Because the defect issue of the amorphous silicon itself, such as too many defects result in low on state current, low mobility, poor stability, which is restricted in application. For compensating the defect of the amorphous silicon itself and expanding the application field, The LTPS (Low Temperature Poly-Silicon) technology is born at the right moment.

Because of the atom alignment rule, the carrier mobility of the LTPS is high (10-300 $cm^2/Vs$). When it is applied in electronic elements of the Thin Film Transistor (TFT), it can make the TFT possess higher driving current. Therefore, in the manufacture process of the TFT, the LTPS thin film is widely utilized to be material of the active layer, which is one of the core structures of the TFT.

The liquid crystal display utilizing LTPS TFT possesses advantages of high resolution, fast response, high brightness, high aperture ratio, et cetera. Because the silicon crystallization of the LTPS has better order than the amorphous silicon, it makes the electron mobility higher relatively above 100 times, and in the meantime, the peripheral driving circuit is manufactured on the glass substrate to achieve the objective of the system integration to save the space and the cost of the driving IC; meanwhile, cause of the driving IC circuit directly manufactured on the panel, the external connection points of the assembly can be can be diminished to raise the reliability. The maintenance is easier and the assembly process time can be shortened. Thus, the time schedule of the application system design is reduced and the design possibility is enlarged.

However, with the constant decrease of the size of the thin film transistor element, the obvious short channel effect appears to the LTPS TFT, which is mainly caused by the strong electrical field at the drain end. The effects, such as hot carrier effect caused thereby will influence the reliability and stability of the element. At present, a common utilized method is to introduce the Lightly Doped Drain (LDD) or the Offset structure. However, manufacture LDD structure requires one additional photolithography process, and the offset can easily occur in the alignment; the Offset structure might have chance to decrease the switch on current of the element.

SUMMARY OF THE INVENTION

An objective of the present invention is to provide a manufacture method of a LTPS thin film transistor. By locating one transition region, which is similar to LDD or Offset structure, at least between the channel region and the drain contact region in the active layer, the gate isolation layer above the transition region is thicker than the channel region and can weaken the electrical field of the channel region close to drain. The hot carrier effect and the short channel effect can be restrained to raise the reliability of the element. The manufacture method is simple and the LDD manufacture process is omitted to eliminate one mask and to reduce the production cost.

Another objective of the present invention is to provide a LTPS thin film transistor. By locating one transition region, which is similar to LDD or Offset structure, at least between the channel region and the drain contact region in the active layer, the gate isolation layer above the transition region is thicker than the channel region and can weaken the electrical field of the channel region close to drain. The hot carrier effect and the short channel effect can be restrained to raise the reliability of the element. The switch off current of the element is reduced in condition that the switch on current is not decreased.

The present invention first provides a manufacture method of a LTPS thin film transistor, comprising steps of:

step 1, providing a substrate, and performing clean and pre-cure to the substrate;

step 2, depositing a buffer layer on the substrate;

step 3, depositing an amorphous silicon layer on the buffer layer, and implementing crystallization in a way of excimer laser annealing laser crystallization or solid phase crystallization to form a polysilicon layer, and implementing pattern process to the polysilicon layer with one photolithographic process to form an active layer;

step 4, depositing a gate isolation layer;

step 5, etching the gate isolation layer with one photolithographic process to etch a recess in the gate isolation layer above the active layer;

step 6, depositing a first metal layer, and implementing pattern process to the first metal layer with one photolithographic process to form a gate correspondingly above the recess, and preserving a photoresist layer above the gate, and a width of the gate is larger than a width of the recess, and left, right two sides of the gate go beyond left, right sides of the recess with a distance;

step 7, employing the gate covered with the photoresist layer to be a mask to implement ion implantation to the active layer to form a source contact region and a drain contact region located at two sides of the active layer; a channel region is formed in the active layer corresponding to a region of the recess; a first transition region, a second transition region are respectively formed among the source contact region, the drain contact region and the channel region, and the first transition region, the second transition region respectively correspond to portions of the left, right two sides of the gate going beyond the left, right sides of the recess;

step 8, removing the photoresist layer covering the gate, and depositing an interlayer dielectric layer on the gate and the gate isolation layer, and respectively forming a source contact hole, a drain contact hole in the interlayer dielectric layer and the gate isolation layer corresponding to the source contact region, the drain contact region with one photolithographic process;

step 9, depositing a second metal layer, and implementing pattern process to the second metal layer with one photolithographic process to form a source and a drain; the source and the drain respectively contact with the source contact region, the drain contact region in the active layer through the source contact hole, the drain contact hole.

In the step 6, the distance that the left, right sides of the gate going beyond the left, right sides of the recess is ⅒-⅕ of the width of the recess.

In the step 7, phosphorus ion implantation is implemented to the active layer, and both the obtained source contact region and the obtained drain contact region are N-type doped regions;

or, in the step 7, boron ion implantation is implemented to the active layer, and both the obtained source contact region and the obtained drain contact region are P-type doped regions.

The present invention further provides another manufacture method of a LTPS thin film transistor, comprising steps of:

step 1, providing a substrate, and performing clean and pre-cure to the substrate;

step 2, deposing a buffer layer on the substrate;

step 3, deposing an amorphous silicon layer on the buffer layer, and implementing crystallization in a way of excimer laser annealing laser crystallization or solid phase crystallization to form a polysilicon layer, and implementing pattern process to the polysilicon layer with one photolithographic process to form an active layer;

step 4, deposing a gate isolation layer;

step 5, etching the gate isolation layer with one photolithographic process to etch a recess in the gate isolation layer above the active layer;

step 6, deposing a first metal layer, and implementing pattern process to the first metal layer with one photolithographic process to form a gate correspondingly above the recess, and preserving a photoresist layer above the gate, and a width of the gate is larger than a width of the recess, and a left side of the gate is aligned with a left side of the recess, and a right side of the gate goes beyond a right side of the recess with a distance;

step 7, employing the gate covered with the photoresist layer to be a mask to implement ion implantation to the active layer to form a source contact region and a drain contact region located at two sides of the active layer; a channel region is formed in the active layer corresponding to a region of the recess; a transition region is formed between the drain contact region and the channel region, and the transition region corresponds to a portion of the right side of the gate going beyond the right side of the recess;

step 8, removing the photoresist layer covering the gate, and deposing an interlayer dielectric layer on the gate and the gate isolation layer, and respectively forming a source contact hole, a drain contact hole in the interlayer dielectric layer and the gate isolation layer corresponding to the source contact region, the drain contact region with one photolithographic process;

step 9, deposing a second metal layer, and implementing pattern process to the second metal layer with one photolithographic process to form a source and a drain; the source and the drain respectively contact with the source contact region, the drain contact region in the active layer through the source contact hole, the drain contact hole.

In the step 6, the distance that the right side of the gate going beyond the right side of the recess is ⅒-⅕ of the width of the recess.

In the step 7, phosphorus ion implantation is implemented to the active layer, and both the obtained source contact region and the obtained drain contact region are N-type doped regions;

or, in the step 7, boron ion implantation is implemented to the active layer, and both the obtained source contact region and the obtained drain contact region are P-type doped regions.

The present invention further provides a LTPS thin film transistor, comprising a substrate, a buffer layer located on the substrate, an active layer located on the buffer layer, a gate isolation layer being located on the buffer layer and covering the buffer layer and the active layer, a gate located on the gate isolation layer, an interlayer dielectric layer being located on the gate isolation layer and covering the gate and a source and a drain located on the interlayer dielectric layer;

a source contact hole, a drain contact hole respectively corresponding to a source contact region, a drain contact region are located on the interlayer dielectric layer and the gate isolation layer; the source and the drain contact with the source contact region, the drain contact region in the active layer respectively through the source contact hole, the drain contact hole.

A width of the gate is larger than a width of the recess, and left, right two sides of the gate go beyond left, right sides of the recess with a distance;

the active layer comprises a channel region in the middle, the source contact region, the drain contact region located at two sides, and a first transition region, a second transition region are respectively formed among the source contact region, the drain contact region and the channel region, and the first transition region, the second transition region respectively correspond to portions of the left, right two sides of the gate going beyond the left, right sides of the recess. A width of the gate is larger than a width of the recess, and a left side of the gate is aligned with a left side of the recess, and a right side of the gate goes beyond a right side of the recess with a distance;

the active layer comprises a channel region in the middle, the source contact region, the drain contact region located at two sides, and a transition region located between the drain contact region and the channel region; the transition region corresponds to a portion of the right side of the gate going beyond the right side of the recess.

Both the source contact region and the drain contact region are N-type doped regions or P-type doped regions.

The benefits of the present invention are: in the manufacture method of the LTPS thin film transistor according to the present invention, the gate isolation layer is first etched to form the recess, and then the gate is formed on the recess so that the width of the gate is slightly larger than the width of the recess. Then, the active layer is implemented with ion implantation to form the source contact region, the drain contact region, the channel region and one transition region at least located between the drain contact region and the channel region. The gate isolation layer above the transition region is thicker than the channel region and can shield a part of the gate electrical field to make the carrier density here lower than the channel region. The edge of the channel close to the drain is influenced by the transverse electrical field and will be weakened in certain level to form a transition. Accordingly, the damage to the element due to the large electrical field at the drain is restrained; the manufacture method is simple and the LDD manufacture process is omitted to eliminate one mask and to reduce the production cost. In the LTPS thin film transistor according to the present invention, by locating one transition region, which is similar to LDD or Offset structure, at least between the channel region and the drain contact region in the active layer, the gate isolation layer above the transition region is thicker than the channel region and can weaken the electrical field of the channel region close to drain. The hot carrier effect and the short channel effect can be restrained to raise the reliability of the element. The switch off current of the element is reduced in condition that the switch on current is not decreased.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
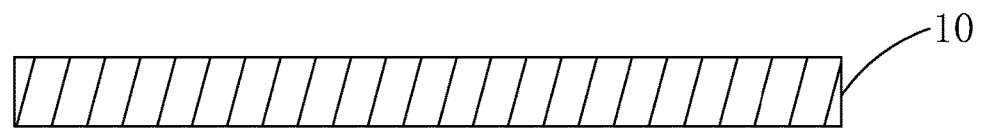
FIG. 1 is a diagram of the step 1 of a manufacture method of a LTPS thin film transistor according to the present invention.
Figure 2:
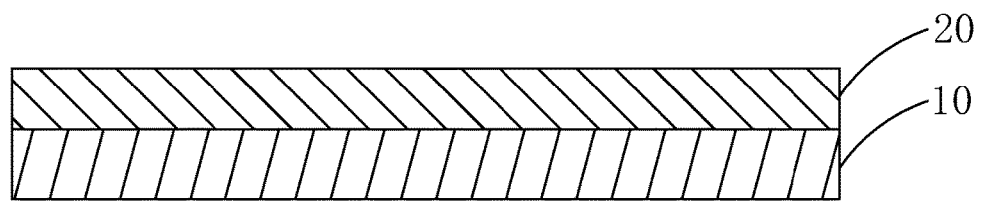
FIG. 2 is a diagram of the step 2 of a manufacture method of a LTPS thin film transistor according to the present invention.

Please refer to FIGS. 1-9. The present invention first provides a manufacture method of a LTPS thin film transistor, comprising steps of:

step 1, as shown in FIG. 1, providing a substrate 10, and performing clean and pre-cure to the substrate 10;

Specifically, the substrate 10 in the step 1 is a glass substrate.

step 2, as shown in FIG. 2, deposing a buffer layer 20 on the substrate 10.

Specifically, the buffer layer 20 in the step 2 is a Silicon Oxide (SiOx) layer, a Silicon Nitride (SiNx) Layer or a stack combination of the Silicon Oxide layer and the Silicon Nitride Layer.

Figure 3:
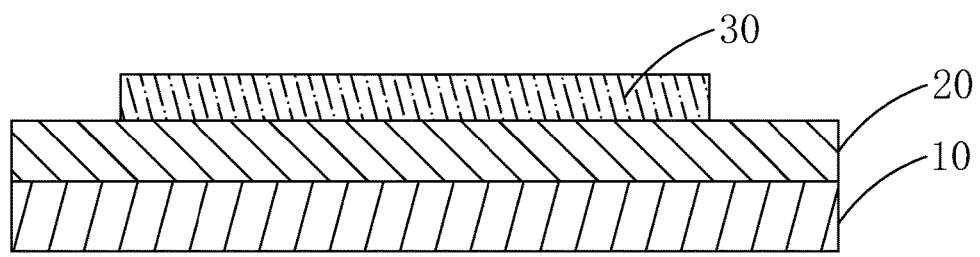
FIG. 3 is a diagram of the step 3 of a manufacture method of a LTPS thin film transistor according to the present invention.

Specifically, a thickness of the buffer layer 20 is 500-4000 Å.

step 3, as shown in FIG. 3, deposing an amorphous silicon (a-Si) layer on the buffer layer 20, and implementing crystallization in a way of ELA (excimer laser annealing) laser crystallization or (SPC) solid phase crystallization to form a polysilicon layer, and implementing pattern process to the polysilicon layer with one photolithographic process to form an active layer 30.

Figure 4:
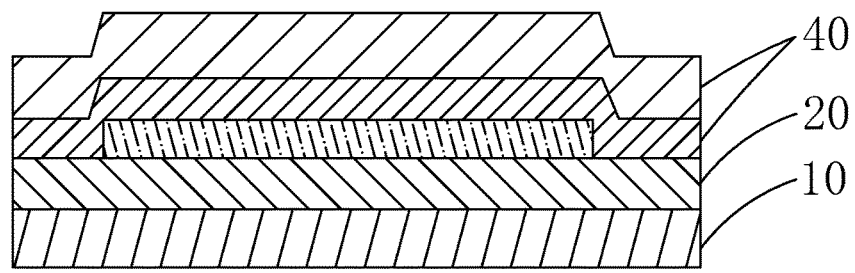
FIG. 4 is a diagram of the step 4 of a manufacture method of a LTPS thin film transistor according to the present invention.

Specifically, a thickness of the amorphous silicon in the step 3 is 500-2000 Å.

step 4, as shown in FIG. 4, deposing a gate isolation layer 40.

Specifically, the gate isolation layer 40 in the step 4 is a Silicon Oxide layer, a Silicon Nitride Layer or a stack combination of the Silicon Oxide layer and the Silicon Nitride Layer. As shown in FIG. 4, in the embodiment of the present invention, the gate isolation layer 40 is a stack combination of the Silicon Oxide layer and the Silicon Nitride Layer.

Figure 5:
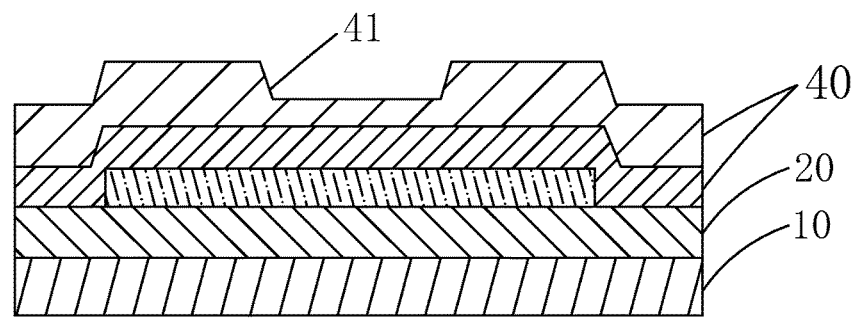
FIG. 5 is a diagram of the step 5 of a manufacture method of a LTPS thin film transistor according to the present invention.

Specifically, a thickness of the gate isolation layer 40 is 500-4000 Å.

step 5, as shown in FIG. 5, etching the gate isolation layer 40 with one photolithographic process to etch a recess 41 in the gate isolation layer 40 above the active layer 30.

Figure 6:
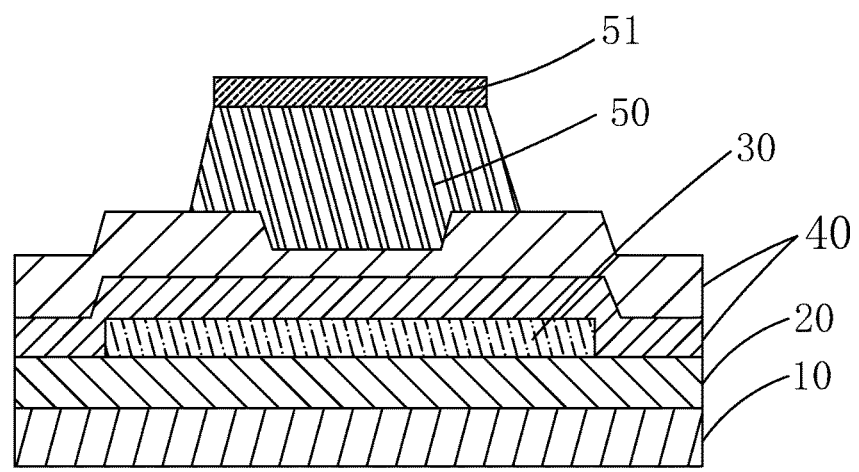
FIG. 6 is a diagram of the step 6 of the first embodiment in a manufacture method of a LTPS thin film transistor according to the present invention.

Specifically, a height of the recess 41 in the step 5 is 300-1000 Å.

step 6, as shown in FIG. 6, deposing a first metal layer, and implementing pattern process to the first metal layer with one photolithographic process to form a gate 50 correspondingly above the recess 41, and preserving a photoresist layer 51 above the gate 50, and a width of the gate 50 is larger than a width of the recess 41, and left, right two sides of the gate 50 go beyond left, right sides of the recess 41 with a distance.

Preferably, the distance that the left, right sides of the gate 50 going beyond the left, right sides of the recess 41 is 1/10-1/5 of the width L of the recess 41.

The first metal layer is one single molybdenum (Mo) layer, one single aluminum (Al) layer or a compound layer structure of two molybdenum layers sandwiching one aluminum layer.

Specifically, a thickness of the first metal layer is 1500-2000 Å.

Figure 7:
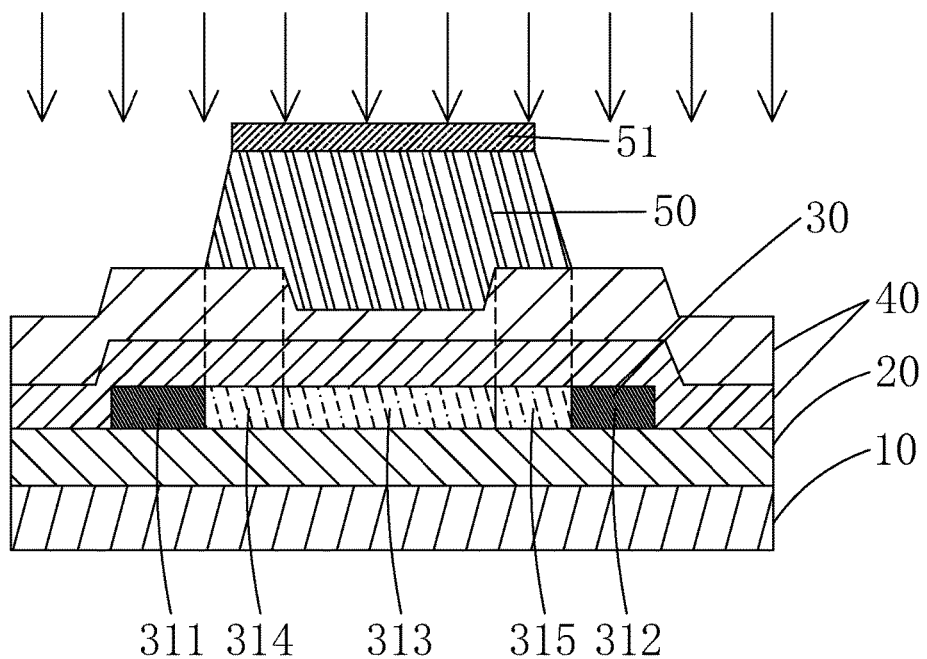
FIG. 7 is a diagram of the step 7 of the first embodiment in a manufacture method of a LTPS thin film transistor according to the present invention.

Specifically, the photolithographic process comprises procedures of photoresist coating, exposure, development and etching.

step 7, as shown in FIG. 7, employing the gate 50 covered with the photoresist layer 51 to be a mask to implement ion implantation to the active layer 30 to form a source contact region 311 and a drain contact region 312 located at two sides of the active layer 30; a channel region 313 is formed in the active layer 30 corresponding to a region of the recess 41; a first transition region 314, a second transition region 315 are respectively formed among the source contact region 311, the drain contact region 312 and the channel region 313, and the first transition region 314, the second transition region 315 respectively correspond to portions of the left, right two sides of the gate 50 going beyond the left, right sides of the recess 41.

Specifically, the step 7 can utilize PH3 (phosphorus hydride) gas to implement phosphorus ion (P+) implantation to the active layer 30. Thus, both the obtained source contact region 311 and the obtained drain contact region 312 are N-type doped regions. The ion doped in the N-type doped regions is phosphorus ion.

The step 7 also can utilize B2H6 (diborane) gas to implement boron ion (B+) implantation to the active layer 30. Thus, both the obtained source contact region 311 and the obtained drain contact region 312 are P-type doped regions. The ion doped in the P-type doped regions is boron ion.

Figure 8:
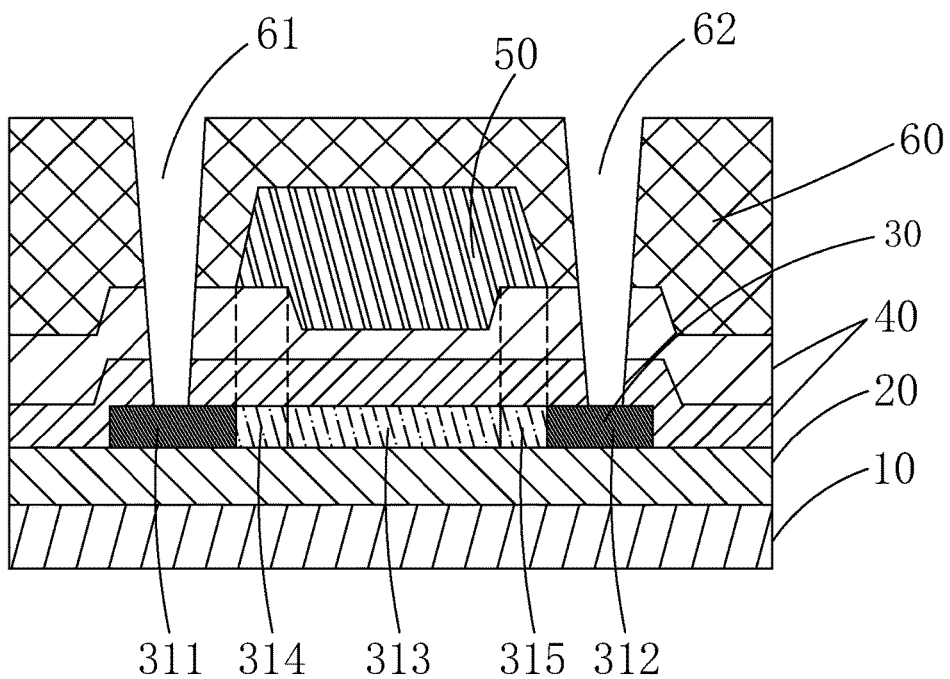
FIG. 8 is a diagram of the step 8 of the first embodiment in a manufacture method of a LTPS thin film transistor according to the present invention.

With preserving the photoresist layer 51 above the gate 50, the ions can be prevented being injected into the gate 50 in the procedure of ion implantation.

step 8, as shown in FIG. 8, removing the photoresist layer 51 covering the gate 50, and deposing an interlayer dielectric layer (ILD) 60 on the gate 50 and the gate isolation layer 40, and respectively forming a source contact hole 61, a drain contact hole 62 in the interlayer dielectric layer 60 and the gate isolation layer 40 corresponding to the source contact region 311, the drain contact region 312 with one photolithographic process.

Specifically, the interlayer dielectric layer 60 in the step 8 is a Silicon Oxide (SiOx) layer, a Silicon Nitride (SiNx) Layer or a stack combination of the Silicon Oxide layer and the Silicon Nitride Layer.

Figure 9:
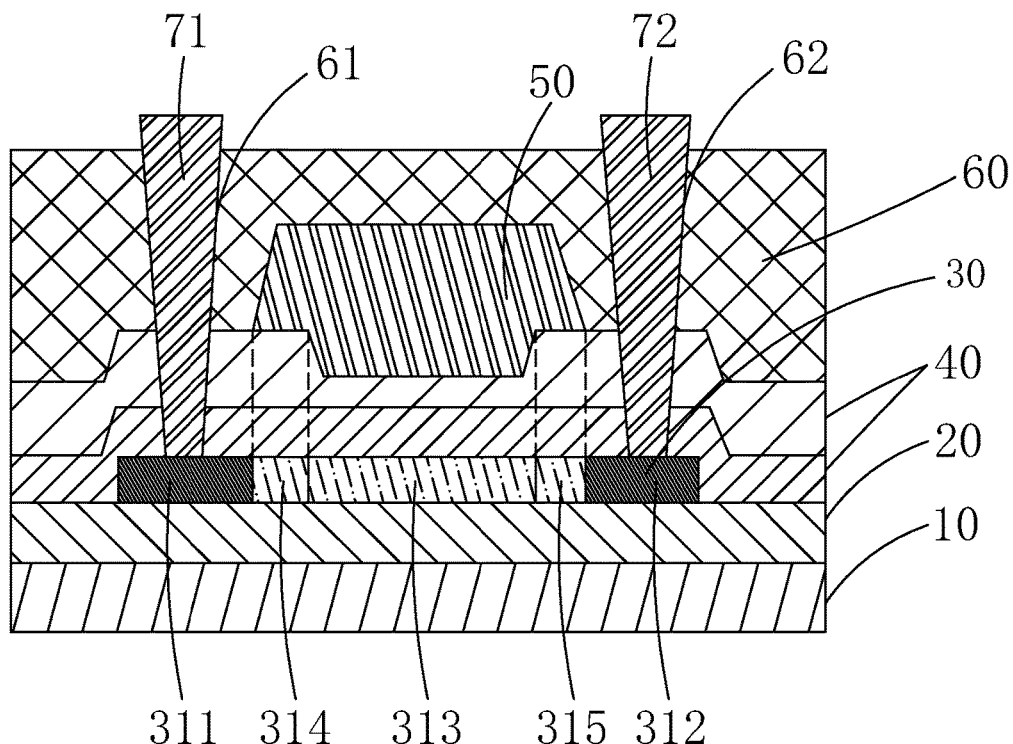
FIG. 9 is a diagram of the step 9 of the first embodiment in a manufacture method of a LTPS thin film transistor according to the present invention, i.e. a structure diagram of the first embodiment according to a LTPS thin film transistor of the present invention.

Specifically, a thickness of the interlayer dielectric layer 60 is 2000-6000 Å.

step 9, as shown in FIG. 9, deposing a second metal layer, and implementing pattern process to the second metal layer with one photolithographic process to form a source 71 and a drain 72; the source 71 and the drain 72 respectively contact with the source contact region 311, the drain contact region 312 in the active layer 30 through the source contact hole 61, the drain contact hole 62.

Specifically, the second metal layer in the step 9 is one single molybdenum (Mo) layer, one single aluminum (Al) layer or a compound layer structure of two molybdenum layers sandwiching one aluminum layer.

Specifically, a thickness of the second metal layer is 1500-2000 Å.

In the aforesaid manufacture method of the LTPS thin film transistor, the gate isolation layer 40 is first etched to form the recess 41, and then the gate 50 is formed on the recess 41 so that the width of the gate 50 is slightly larger than the width of the recess 41, and left, right two sides of the gate 50 go beyond left, right sides of the recess 41 with a distance; then, the active layer 30 is implemented with ion implantation to form the source contact region 311, the drain contact region 312, the channel region 313 and the first, second transition regions 314, 315 located between the source contact region 311, the drain contact region 312 and the channel region 313. The gate isolation layer 40 above the first, the second transition regions 314, 315 is thicker than the channel region 313 and can shield a part of the gate electrical field to make the carrier density here lower than the channel region. The edge of the channel close to the drain is influenced by the transverse electrical field and will be weakened in certain level to form a transition. Accordingly, the damage to the element due to the large electrical field at the drain is restrained.

On the basis of the aforesaid manufacture method of the LTPS thin film transistor, the present invention further provides a LTPS thin film transistor. AS shown in FIG. 9, the first embodiment of the LTPS thin film transistor according to the present invention comprises: a substrate 10, a buffer layer 20 located on the substrate 10, an active layer 30 located on the buffer layer 20, a gate isolation layer 40 being located on the buffer layer 20 and covering the buffer layer 20 and the active layer 30, a gate 50 located on the gate isolation layer 40, an interlayer dielectric layer 60 being located on the gate isolation layer 40 and covering the gate 50, and a source 71 and a drain 72 located on the interlayer dielectric layer 60.

A width of the gate 50 is larger than a width of the recess 41, and left, right two sides of the gate 50 go beyond left, right sides of the recess 41 with a distance;

the active layer 30 comprises a channel region 313 in the middle, the source contact region 311, the drain contact region 312 located at two sides, and a first transition region 314, a second transition region 315 are respectively formed among the source contact region 311, the drain contact region 312 and the channel region 313, and the first transition region 314, the second transition region 315 respectively correspond to portions of the left, right two sides of the gate 50 going beyond the left, right sides of the recess 41.

Furthermore, a source contact hole 61, a drain contact hole 62 respectively corresponding to the source contact region 311, the drain contact region 312 are located on the interlayer dielectric layer 60 and the gate isolation layer 40; the source 71 and the drain 72 respectively contact with the source contact region 311, the drain contact region 312 in the active layer 30 through the source contact hole 61, the drain contact hole 62.

Specifically, both the source contact region 311 and the drain contact region 312 are N-type doped regions, the ion doped in the N-type doped regions is phosphorus ion;

or both the source contact region 311 and the drain contact region 312 are P-type doped regions, the ion doped in the P-type doped regions is boron ion.

Specifically, a height of the recess 41 is 300-1000 Å.

The distance that the left, right sides of the gate 50 going beyond the left, right sides of the recess 41 is 1/10-1/5 of the width L of the recess 41.

Specifically, the substrate 10 is a glass substrate.

The buffer layer 20, the gate isolation layer 40 are Silicon Oxide layers, Silicon Nitride Layers or stack combinations of the Silicon Oxide layer and the Silicon Nitride Layer. Specifically, thicknesses of the buffer layer 20, the gate isolation layer 40 are 500-4000 Å.

The interlayer dielectric layer 60 is a Silicon Oxide (SiOx) layer, a Silicon Nitride (SiNx) Layer or a stack combination of the Silicon Oxide layer and the Silicon Nitride Layer. Specifically, a thickness of the interlayer dielectric layer 60 is 2000-6000 Å.

The gate 50, the source, the drain 71, 72 are one single molybdenum (Mo) layers, one single aluminum (Al) layers or compound layer structures of two molybdenum layers sandwiching one aluminum layer. Specifically, thicknesses of the gate 50, the source, the drain 71, 72 are 1500-2000 Å.

In the aforesaid LTPS thin film transistor, by locating the first, the second transition regions between the channel region and the source contact region, the drain contact region in the active layer, the gate isolation layer above the first, the second transition regions is thicker than the channel region and can weaken the electrical field of the channel region close to drain. The hot carrier effect and the short channel effect can be restrained to raise the reliability of the element. The switch off current of the element is reduced in condition that the switch on current is not decreased.

Please refer to FIGS. 1-5 and FIGS. 10-13. The present invention further provides another manufacture method of a LTPS thin film transistor, comprising steps of:

step 1, as shown in FIG. 1, providing a substrate 10, and performing clean and pre-cure to the substrate 10;

Specifically, the substrate 10 in the step 1 is a glass substrate.

step 2, as shown in FIG. 2, deposing a buffer layer 20 on the substrate 10.

Specifically, the buffer layer 20 in the step 2 is a Silicon Oxide (SiOx) layer, a Silicon Nitride (SiNx) Layer or a stack combination of the Silicon Oxide layer and the Silicon Nitride Layer.

Specifically, a thickness of the buffer layer 20 is 500-4000 Å.

step 3, as shown in FIG. 3, deposing an amorphous silicon (a-Si) layer on the buffer layer 20, and implementing crystallization in a way of ELA (excimer laser annealing) laser crystallization or (SPC) solid phase crystallization to form a polysilicon layer, and implementing pattern process to the polysilicon layer with one photolithographic process to form an active layer 30.

Specifically, a thickness of the amorphous silicon in the step 3 is 500-2000 Å.

step 4, as shown in FIG. 4, deposing a gate isolation layer 40.

Specifically, the gate isolation layer 40 in the step 4 is a Silicon Oxide layer, a Silicon Nitride Layer or a stack combination of the Silicon Oxide layer and the Silicon Nitride Layer. As shown in FIG. 4, in the embodiment of the present invention, the gate isolation layer 40 is a stack combination of the Silicon Oxide layer and the Silicon Nitride Layer.

Specifically, a thickness of the gate isolation layer 40 is 500-4000 Å.

step 5, as shown in FIG. 5, etching the gate isolation layer 40 with one photolithographic process to etch a recess 41 in the gate isolation layer 40 above the active layer 30.

Figure 10:
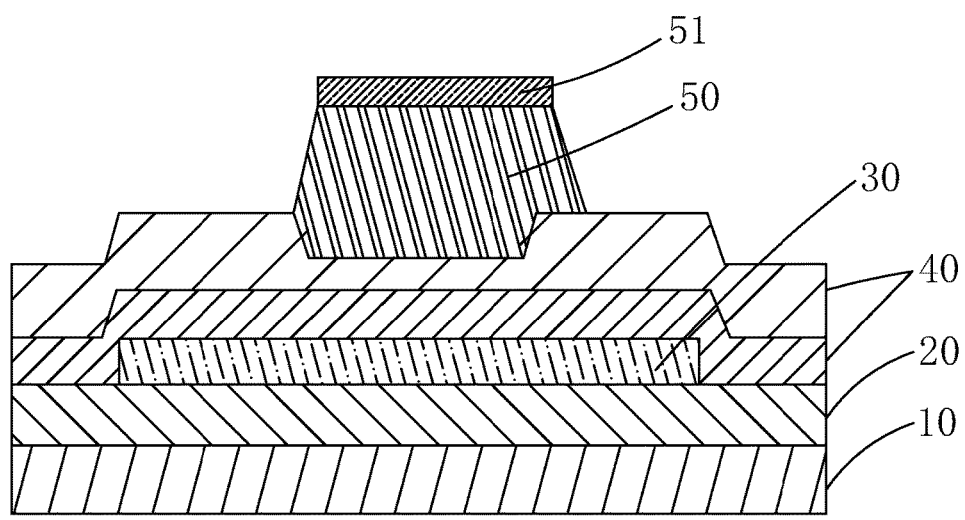
FIG. 10 is a diagram of the step 6 of the second embodiment in a manufacture method of a LTPS thin film transistor according to the present invention.

Specifically, a height of the recess 41 in the step 5 is 300-1000 Å.

step 6, as shown in FIG. 10, deposing a first metal layer, and implementing pattern process to the first metal layer with one photolithographic process to form a gate 50 correspondingly above the recess 41, and preserving a photoresist layer 51 above the gate 50, and a width of the gate 50 is larger than a width of the recess 41, and a left side of the gate 50 is aligned with a left side of the recess 41, and a right side of the gate 50 goes beyond a right side of the recess 41 with a distance.

Preferably, the distance that the right side of the gate 50 going beyond the right side of the recess 41 is ⅒-⅕ of the width L of the recess 41.

The first metal layer is one single molybdenum (Mo) layer, one single aluminum (Al) layer or a compound layer structure of two molybdenum layers sandwiching one aluminum layer.

Specifically, a thickness of the first metal layer is 1500-2000 Å.

Figure 11:
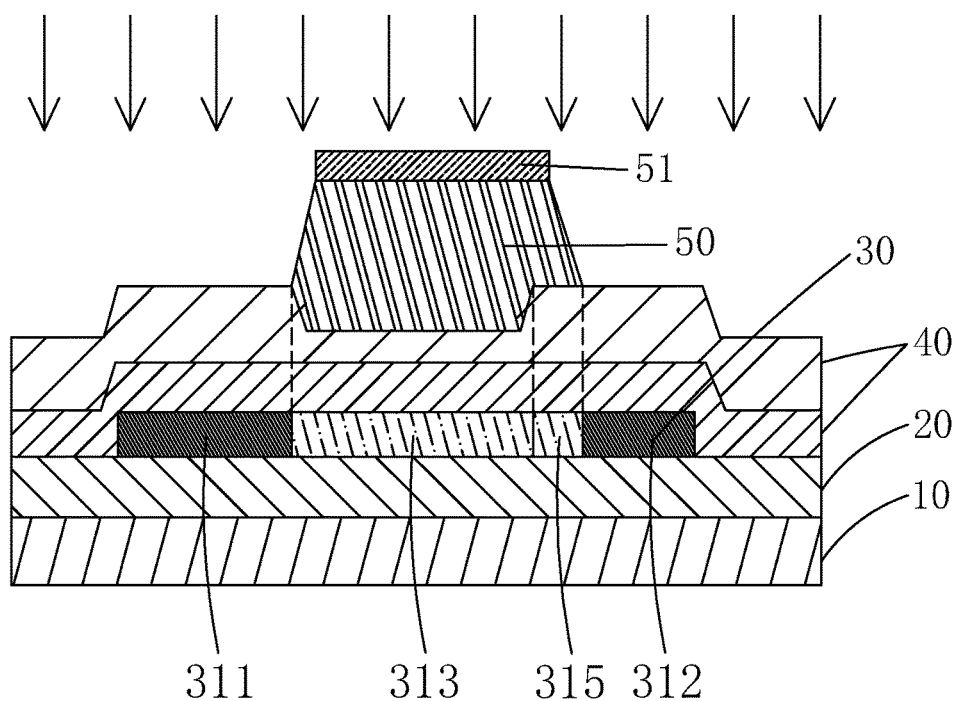
FIG. 11 is a diagram of the step 7 of the second embodiment in a manufacture method of a LTPS thin film transistor according to the present invention.
Figure 12:
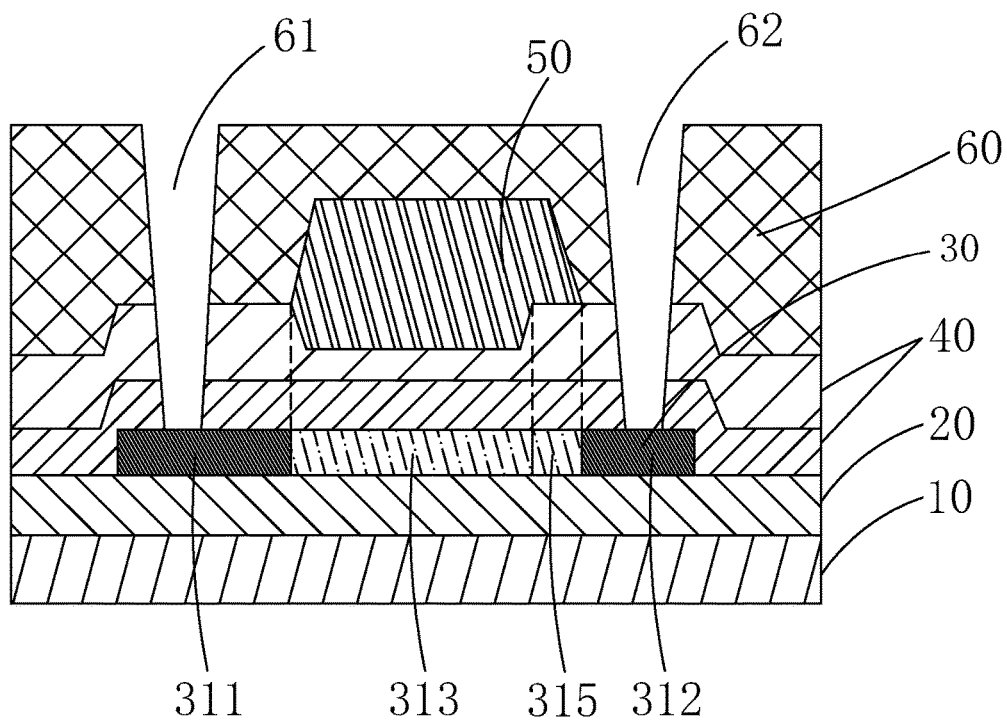
FIG. 12 is a diagram of the step 8 of the second embodiment in a manufacture method of a LTPS thin film transistor according to the present invention.

Specifically, the photolithographic process comprises procedures of photoresist coating, exposure, development and etching.

step 7, as shown in FIG. 11, employing the gate 50 covered with the photoresist layer 51 to be a mask to implement ion implantation to the active layer 30 to form a source contact region 311 and a drain contact region 312 located at two sides of the active layer 30; a channel region 313 is formed in the active layer 30 corresponding to a region of the recess 41; a transition region 315 is formed between the drain contact region 312 and the channel region 313, and the transition region 315 corresponds to a portion of the right side of the gate 50 going beyond the right side of the recess 41.

Specifically, the step 7 can utilize PH3 (phosphorus hydride) gas to implement phosphorus ion (P+) implantation to the active layer 30. Thus, both the obtained source contact region 311 and the obtained drain contact region 312 are N-type doped regions. The ion doped in the N-type doped regions is phosphorus ion.

The step 7 also can utilize B2H6 (diborane) gas to implement boron ion (B+) implantation to the active layer 30. Thus, both the obtained source contact region 311 and the obtained drain contact region 312 are P-type doped regions. The ion doped in the P-type doped regions is boron ion.

With preserving the photoresist layer 51 above the gate 50, the ions can be prevented being injected into the gate 50 in the procedure of ion implantation.

step 8, as shown in FIG. 8, removing the photoresist layer 51 covering the gate 50, and deposing an interlayer dielectric layer (ILD) 60 on the gate 50 and the gate isolation layer 40, and respectively forming a source contact hole 61, a drain contact hole 62 in the interlayer dielectric layer 60 and the gate isolation layer 40 corresponding to the source contact region 311, the drain contact region 312 with one photolithographic process.

Specifically, the interlayer dielectric layer 60 in the step 8 is a Silicon Oxide (SiOx) layer, a Silicon Nitride (SiNx) Layer or a stack combination of the Silicon Oxide layer and the Silicon Nitride Layer.

Specifically, a thickness of the interlayer dielectric layer 60 is 2000-6000 Å.

step 9, as shown in FIG. 9, deposing a second metal layer, and implementing pattern process to the second metal layer with one photolithographic process to form a source 71 and a drain 72; the source 71 and the drain 72 respectively contact with the source contact region 311, the drain contact region 312 in the active layer 30 through the source contact hole 61, the drain contact hole 62.

Specifically, the second metal layer in the step 9 is one single molybdenum (Mo) layer, one single aluminum (Al) layer or a compound layer structure of two molybdenum layers sandwiching one aluminum layer.

Specifically, a thickness of the second metal layer is 1500-2000 Å.

In the manufacture method of the LTPS thin film transistor according to the present invention, the gate isolation layer 40 is first etched to form the recess 41, and then the gate 50 is formed on the recess 41 so that the width of the gate 50 is slightly larger than the width of the recess 41, and a left side of the gate 50 is aligned with a left side of the recess 41, and a right side of the gate 50 goes beyond a right side of the recess 41 with a distance; then, the active layer 30 is implemented with ion implantation to form the source contact region 311, the drain contact region 312, the channel region 313 and the transition region 315 located between the drain contact region 312 and the channel region 313. The gate isolation layer 40 above the transition region 315 is thicker than the channel region 313 and can shield a part of the gate electrical field to make the carrier density here lower than the channel region. The edge of the channel close to the drain is influenced by the transverse electrical field and will be weakened in certain level to form a transition. Accordingly, the damage to the element due to the large electrical field at the drain is restrained.

Figure 13:
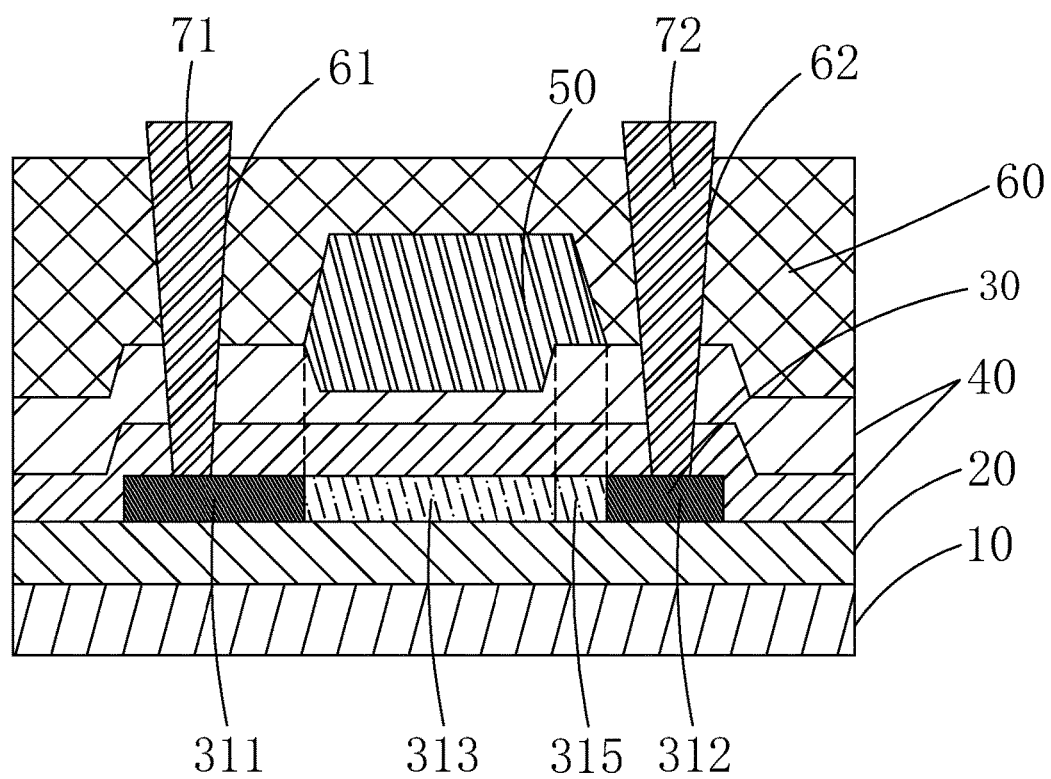
FIG. 13 is a diagram of the step 9 of the second embodiment in a manufacture method of a LTPS thin film transistor according to the present invention, i.e. a structure diagram of the second embodiment according to a LTPS thin film transistor of the present invention.

On the basis of the aforesaid manufacture method of the LTPS thin film transistor, the present invention further provides a LTPS thin film transistor. AS shown in FIG. 13, the first embodiment of the LTPS thin film transistor according to the present invention comprises: a substrate 10, a buffer layer 20 located on the substrate 10, an active layer 30 located on the buffer layer 20, a gate isolation layer 40 being located on the buffer layer 20 and covering the buffer layer 20 and the active layer 30, a gate 50 located on the gate isolation layer 40, an interlayer dielectric layer 60 being located on the gate isolation layer 40 and covering the gate 50, and a source 71 and a drain 72 located on the interlayer dielectric layer 60.

A width of the gate 50 is larger than a width of the recess 41, and a left side of the gate 50 is aligned with a left side of the recess 41, and a right side of the gate 50 goes beyond a right side of the recess 41 with a distance;

the active layer 30 comprises a channel region 313 in the middle, the source contact region 311, the drain contact region 312 located at two sides, and a transition region 315 located between the drain contact region 312 and the channel region 313; the transition region 315 corresponds to a portion of the right side of the gate 50 going beyond the right side of the recess 41.

Furthermore, a source contact hole 61, a drain contact hole 62 respectively corresponding to the source contact region 311, the drain contact region 312 are located on the interlayer dielectric layer 60 and the gate isolation layer 40; the source 71 and the drain 72 respectively contact with the source contact region 311, the drain contact region 312 in the active layer 30 through the source contact hole 61, the drain contact hole 62.

Specifically, both the source contact region 311 and the drain contact region 312 are N-type doped regions, the ion doped in the N-type doped regions is phosphorus ion;

or both the source contact region 311 and the drain contact region 312 are P-type doped regions, the ion doped in the P-type doped regions is boron ion.

Specifically, a height of the recess 41 is 300-1000 Å.

The distance that the right side of the gate 50 going beyond the right side of the recess 41 is $1/10$-$1/5$ of the width L of the recess 41.

Specifically, the substrate 10 is a glass substrate.

The buffer layer 20, the gate isolation layer 40 are Silicon Oxide layers, Silicon Nitride Layers or stack combinations of the Silicon Oxide layer and the Silicon Nitride Layer. Specifically, thicknesses of the buffer layer 20, the gate isolation layer 40 are 500-4000 Å.

The interlayer dielectric layer 60 is a Silicon Oxide (SiOx) layer, a Silicon Nitride (SiNx) Layer or a stack combination of the Silicon Oxide layer and the Silicon Nitride Layer. Specifically, a thickness of the interlayer dielectric layer 60 is 2000-6000 Å.

The gate 50, the source, the drain 71, 72 are one single molybdenum (Mo) layers, one single aluminum (Al) layers or compound layer structures of two molybdenum layers sandwiching one aluminum layer. Specifically, thicknesses of the gate 50, the source, the drain 71, 72 are 1500-2000 Å.

In the aforesaid LTPS thin film transistor, by locating one transition region between the channel region and the drain contact region in the active layer, the gate isolation layer above the transition region is thicker than the channel region and can weaken the electrical field of the channel region close to drain. The hot carrier effect and the short channel effect can be restrained to raise the reliability of the element. The switch off current of the element is reduced in condition that the switch on current is not decreased.

In conclusion, in the manufacture method of the LTPS thin film transistor according to the present invention, the gate isolation layer is first etched to form the recess, and then the gate is formed on the recess so that the width of the gate is slightly larger than the width of the recess. Then, the active layer is implemented with ion implantation to form the source contact region, the drain contact region, the channel region and one transition region at least located between the drain contact region and the channel region. The gate isolation layer above the transition region is thicker than the channel region and can shield a part of the gate electrical field to make the carrier density here lower than the channel region. The edge of the channel close to the drain is influenced by the transverse electrical field and will be weakened in certain level to form a transition. Accordingly, the damage to the element due to the large electrical field at the drain is restrained; the manufacture method is simple and the LDD manufacture process is omitted to eliminate one mask and to reduce the production cost. In the LTPS thin film transistor according to the present invention, by locating one transition region, which is similar to LDD or Offset structure, at least between the channel region and the drain contact region in the active layer, the gate isolation layer above the transition region is thicker than the channel region and can weaken the electrical field of the channel region close to drain. The hot carrier effect and the short channel effect can be restrained to raise the reliability of the element. The switch off current of the element is reduced in condition that the switch on current is not decreased.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a LTPS thin film transistor, comprising steps of:
    step 1, providing a substrate, and performing clean and pre-cure to the substrate;
    step 2, deposing a buffer layer on the substrate;
    step 3, deposing an amorphous silicon layer on the buffer layer, and implementing crystallization in a way of excimer laser annealing laser crystallization or solid phase crystallization to form a polysilicon layer, and implementing pattern process to the polysilicon layer with one photolithographic process to form an active layer;
    step 4, deposing a gate isolation layer;
    step 5, etching the gate isolation layer with one photolithographic process to etch a recess in the gate isolation layer above the active layer;
    step 6, deposing a first metal layer, and implementing pattern process to the first metal layer with one photolithographic process to form a gate correspondingly above the recess, and preserving a photoresist layer above the gate, and a width of the gate is larger than a width of the recess, and a left side and a right side of the gate extend beyond a left side and a right side of the recess with a distance;

step 7, employing the gate covered with the photoresist layer to be a mask to implement ion implantation to the active layer to form a source contact region and a drain contact region located at two sides of the active layer; a channel region is formed in the active layer corresponding to a region of the recess; a first transition region, a second transition region are respectively formed among the source contact region, the drain contact region and the channel region, and the first transition region, the second transition region respectively correspond to portions of the left, right two sides of the gate going beyond the left, right sides of the recess;

step 8, removing the photoresist layer covering the gate, and depositing an interlayer dielectric layer on the gate and the gate isolation layer, and respectively forming a source contact hole, a drain contact hole in the interlayer dielectric layer and the gate isolation layer corresponding to the source contact region, the drain contact region with one photolithographic process;

step 9, depositing a second metal layer, and implementing pattern process to the second metal layer with one photolithographic process to form a source and a drain; the source and the drain respectively contact with the source contact region, the drain contact region in the active layer through the source contact hole, the drain contact hole.

2. The manufacture method of a LTPS thin film transistor according to claim 1, wherein in the step 6, the distance that the left, right sides of the gate going beyond the left, right sides of the recess is 1/10-1/5 of the width of the recess.

3. The manufacture method of a LTPS thin film transistor according to claim 1, wherein in the step 7, phosphorus ion implantation is implemented to the active layer, and both the obtained source contact region and the obtained drain contact region are N-type doped regions;

or, in the step 7, boron ion implantation is implemented to the active layer, and both the obtained source contact region and the obtained drain contact region are P-type doped regions.

4. A manufacture method of a LTPS thin film transistor, comprising steps of:
step 1, providing a substrate, and performing clean and pre-cure to the substrate;
step 2, depositing a buffer layer on the substrate;
step 3, depositing an amorphous silicon layer on the buffer layer, and implementing crystallization in a way of excimer laser annealing laser crystallization or solid phase crystallization to form a polysilicon layer, and implementing pattern process to the polysilicon layer with one photolithographic process to form an active layer;
step 4, depositing a gate isolation layer;
step 5, etching the gate isolation layer with one photolithographic process to etch a recess in the gate isolation layer above the active layer;
step 6, depositing a first metal layer, and implementing pattern process to the first metal layer with one photolithographic process to form a gate correspondingly above the recess, and preserving a photoresist layer above the gate, and a width of the gate is larger than a width of the recess, and a left side of the gate is aligned with a left side of the recess, and a right side of the gate extend beyond a right side of the recess with a distance;

step 7, employing the gate covered with the photoresist layer to be a mask to implement ion implantation to the active layer to form a source contact region and a drain contact region located at two sides of the active layer; a channel region is formed in the active layer corresponding to a region of the recess; a transition region is formed between the drain contact region and the channel region, and the transition region corresponds to a portion of the right side of the gate going beyond the recess;

step 8, removing the photoresist layer covering the gate, and depositing an interlayer dielectric layer on the gate and the gate isolation layer, and respectively forming a source contact hole, a drain contact hole in the interlayer dielectric layer and the gate isolation layer corresponding to the source contact region, the drain contact region with one photolithographic process;

step 9, depositing a second metal layer, and implementing pattern process to the second metal layer with one photolithographic process to form a source and a drain; the source and the drain respectively contact with the source contact region, the drain contact region in the active layer through the source contact hole, the drain contact hole.

5. The manufacture method of a LTPS thin film transistor according to claim 4, wherein in the step 6, the distance that the right side of the gate going beyond the right side of the recess is 1/10-1/5 of the width of the recess.

6. The manufacture method of a LTPS thin film transistor according to claim 4, wherein in the step 7, phosphorus ion implantation is implemented to the active layer, and both the obtained source contact region and the obtained drain contact region are N-type doped regions;

or, in the step 7, boron ion implantation is implemented to the active layer, and both the obtained source contact region and the obtained drain contact region are P-type doped regions.

7. A LTPS thin film transistor, comprising a substrate, a buffer layer located on the substrate, an active layer located on the buffer layer, a gate isolation layer being located on the buffer layer and covering the buffer layer and the active layer with a recess above the active layer, a gate located on the gate isolation layer, an interlayer dielectric layer being located on the gate isolation layer and covering the gate and a source and a drain located on the interlayer dielectric layer;

a source contact hole, a drain contact hole respectively corresponding to a source contact region, a drain contact region are located on the interlayer dielectric layer and the gate isolation layer; the source contacts with the source contact region in the active layer and the drain contacts with the drain contact region in the active layer respectively through the source contact hole and the drain contact hole;

wherein a width of the gate is larger than a width of the recess, and a left side and a right side of the gate extend beyond a left side and a right side of the recess with a distance;

the active layer comprises a channel region in the middle, the source contact region, the drain contact region located at two sides, and a first transition region, a second transition region are respectively formed among the source contact region, the drain contact region and the channel region, and the first transition region, the second transition region respectively correspond to portions of the left, right two sides of the gate going beyond the left, right sides of the recess.

8. The LTPS thin film transistor according to claim 7, wherein both the source contact region and the drain contact region are N-type doped regions or P-type doped regions.

* * * * *